United States Patent

Carr et al.

Patent Number: 6,093,251
Date of Patent: Jul. 25, 2000

[54] APPARATUS FOR MEASURING THE HEIGHT OF A SUBSTRATE IN A DISPENSING SYSTEM

[75] Inventors: Gregory L. Carr, Newburyport; William Cavallaro, Bradford, both of Mass.

[73] Assignee: Speedline Technologies, Inc., Franklin, Mass.

[21] Appl. No.: 08/803,994

[22] Filed: Feb. 21, 1997

[51] Int. Cl.[7] ........................................ B05C 5/02
[52] U.S. Cl. .................... 118/712; 118/323; 156/360; 156/378
[58] Field of Search ................... 118/712, 663, 118/668, 669, 671, 300, 323; 73/866.5; 427/8; 156/360, 378; 239/71, 73, 227

[56] References Cited

U.S. PATENT DOCUMENTS

| | | |
|---|---|---|
| 1,184,779 | 5/1916 | Shaw . |
| 1,252,875 | 1/1918 | Ashmusen . |
| 1,699,236 | 1/1929 | Goldrick . |
| 2,274,241 | 2/1942 | Lemanski . |
| 2,410,516 | 11/1946 | Muller et al. . |
| 3,586,129 | 6/1971 | Cass . |
| 4,043,711 | 8/1977 | Seino . |
| 4,330,354 | 5/1982 | Deubner et al. ............ 118/712 |
| 4,646,969 | 3/1987 | Sorm et al. . |
| 4,661,368 | 4/1987 | Rohde et al. . |
| 4,762,578 | 8/1988 | Burgin, Jr. et al. ......... 118/712 |
| 4,967,933 | 11/1990 | Maiorca et al. . |
| 5,044,900 | 9/1991 | Cavallaro . |
| 5,052,338 | 10/1991 | Maiorca et al. . |
| 5,110,615 | 5/1992 | Maiorca et al. . |
| 5,119,759 | 6/1992 | Hicks ............................ 118/712 |
| 5,320,250 | 6/1994 | La et al. . |
| 5,437,727 | 8/1995 | Yoneda et al. ............... 118/712 |
| 5,465,879 | 11/1995 | La et al. . |
| 5,505,777 | 4/1996 | Ciardella et al. . |
| 5,507,872 | 4/1996 | Antenucci et al. . |
| 5,666,325 | 9/1997 | Belser et al. . |

FOREIGN PATENT DOCUMENTS

| | | |
|---|---|---|
| 0 478 192 | 1/1992 | European Pat. Off. . |
| 114905 | 4/1918 | United Kingdom . |
| WO 97/13586 | 4/1997 | WIPO . |
| WO 97/18054 | 5/1997 | WIPO . |

OTHER PUBLICATIONS

Engel, Jack, Selecting The Proper Dispensing Tip, *Surface Mount Technology*, Oct. 1990.

Hogan, Brian, J. Adhesive Dispenser Provides ±2% Volume Repeatability, *Design News*, Apr. 11, 1994.

*Primary Examiner*—Laura Edwards
*Attorney, Agent, or Firm*—Mintz, Levin, Cohn, Ferris, Glovsky and Popeo, P.C.

[57] ABSTRACT

A dispensing system and method for dispensing material onto a substrate. In one embodiment, a dispensing system includes a housing, a dispensing apparatus, coupled to the housing, that dispenses a quantity of material onto the substrate, and a measuring probe, coupled to the housing, and positionable over the substrate to measure a distance from a reference point to a location on the top surface of the substrate. Another embodiment of the invention is directed to a method for dispensing material onto a top surface of a substrate using a dispensing system having a dispensing apparatus that dispenses the material at a dispensing distance from the top surface of the substrate. The method includes steps of loading a substrate onto a support plate of the dispensing system, positioning a measuring probe above the substrate at a predetermined height above the support plate, measuring a distance between the measuring probe and the top surface of the substrate, positioning the dispensing apparatus at the dispensing distance above the top surface of the substrate and dispensing material onto the substrate.

8 Claims, 5 Drawing Sheets

APPARATUS FOR MEASURING THE HEIGHT OF A SUBSTRATE IN A DISPENSING SYSTEM

FIELD OF THE INVENTION

The present invention relates generally to a method and apparatus for measuring the height of a substrate, and more particularly, to a method and apparatus for measuring the height of a substrate in a dispensing system that dispenses viscous materials onto the substrate. The height measurement is used to ensure that a dispensing nozzle of the dispensing system is at a predetermined distance above the substrate prior to dispensing the material.

DISCUSSION OF THE RELATED ART

There are several types of prior art dispensing machines used for dispensing metered amounts of liquid or paste for a variety of applications. One such application is in the assembly of printed circuit boards or integrated circuit chips, wherein dispensing machines are used for encapsulating integrated circuits and/or for underfilling flip integrated circuit chips. Prior art dispensing systems are also used for dispensing dots or balls of liquid epoxy or solder onto circuit boards. The liquid epoxy or solder is used to connect components to the circuit boards. The dispensing systems described above include those manufactured and distributed by Camelot Systems Inc., the assignee of the present invention, under the name CAM/A LOT®.

In a typical dispensing system, a pump and dispenser assembly is mounted to a moving assembly for moving the pump and dispenser assembly along three mutually orthogonal axes (x, y, z), typically using servo motors controlled by a computer system or controller. To dispense a dot of liquid on a circuit board at a desired location, the pump and dispenser assembly is moved along the horizontal x and y axes until it is located over the desired location. The pump and dispenser assembly is then lowered along the vertical z-axis until the nozzle is at an appropriate height over the board. The pump and dispenser assembly dispenses a dot of liquid, is then raised along the z-axis, moved along the x and y axes to a next desired location, and lowered along the vertical z-axis to dispense a next liquid dot.

In these dispensing systems, it is critical that the distance between the dispensing nozzle and the circuit board be carefully maintained to ensure that the dot of material is properly dispensed onto the circuit board. Although the absolute location of the nozzle can be precisely controlled by the servo motors and the controller, the z-axis position at which the nozzle must be located to obtain the precise distance above the circuit board is variable because of variations in height among circuit boards that are to receive the dispensed material. Thus, the proper z-axis dispensing position of the nozzle for one circuit board may not be equal to the proper z-axis dispensing position of the nozzle for a second circuit board. Further, in addition to there being variations in height among circuit boards, the upper surface of each circuit board may have irregularities such that the height of a circuit board is different at one location on the circuit board than it is at another location on the circuit board.

In one prior art dispensing system, a touch probe, incorporated into the pump and dispenser assembly, is used to position the nozzle at the desired distance above a circuit board. The touch probe 20 will now be described with reference to FIGS. 1A, 1B and 1C, which show the touch probe 20 disposed over a circuit board 10. Each of FIGS. 1A, 1B and 1C show the touch probe 20 during a different stage of the positioning process.

The touch probe 20 includes a lower housing 22, a pneumatic actuator 24, and a cylinder 26 that extends from the pneumatic actuator to the lower housing. The pneumatic actuator is coupled to an air tube 18 which is coupled to a pressurized air source (not shown). The lower housing 22 is shown in a partially broken away view to show the position of the cylinder 26 within the lower housing. The cylinder 26 has a probe end 28 that during operation of the touch probe extends from the lower housing to contact the circuit board 10. Mounted on one side of the lower housing is a proximity sensor 36 that is implemented using an electromagnetic field to detect a metal target. The proximity sensor is electrically coupled to a controller (not shown) of the dispensing system. The cylinder 26 has a ring 30 made from stainless steel that can be readily detected by the proximity sensor 36.

The touch probe 20 operates in the dispensing system as follows. A circuit board to receive dispensed material at a number of dispensing locations on the top surface of the circuit board is loaded into the dispensing system. For each of the dispensing locations, the touch probe is used to determine the z-axis position of the pump and dispenser assembly that will result in the desired distance between the nozzle and the circuit board. It should be noted, however, that depending on the tolerance of the circuit board, the touch probe may measure the z-axis position at some number of dispensing locations less than the total number of dispensing locations. The touch probe 20, as shown in FIG. 1A, is positioned at a distance $d_1$ above a first dispensing location of the circuit board 10. In FIG. 1, the cylinder 26 is shown in a retracted position such that the entire cylinder is contained within the lower housing 22. The cylinder 26 is held in the retracted position by a spring located in the pneumatic actuator 24. Once the touch probe 20 is in the position shown in FIG. 1A, the controller controls the pressurized air source to supply pressurized air to the pneumatic actuator 24 to actuate the touch probe. The pressurized air compresses the spring releasing the force exerted on the cylinder 26 by the spring, and allowing the cylinder to fall to an actuated position as shown in FIG. 1B.

Once the touch probe is in the actuated position, the controller controls the servo motors of the moving assembly to slowly lower the pump and dispenser assembly, thereby lowering the touch probe 20 which is attached to the pump and dispenser assembly. The controller continues to lower the touch probe until receiving an indication from the proximity sensor 36 that the ring 30 on the cylinder 26 is aligned with the proximity sensor (see FIG. 1C). Upon receipt of the indication from the proximity sensor, the controller stops the movement of the touch probe assembly, and stores the z-axis position of the pump and dispenser assembly. When the controller stops the movement of the pump and dispenser assembly, the lower housing 22 is at a distance $d_2$ from the circuit board. The position of the touch probe on the pump and dispenser assembly is precalibrated such that when the lower housing is at the distance $d_2$ from the circuit board, the nozzle of the pump and dispenser assembly is at the desired dispensing distance above the circuit board.

The calibration procedure described above is repeated for each of the dispensing locations on the circuit board to obtain the proper z-axis dispensing position for each dispensing location. The pump and dispenser assembly is then moved to each of the dispensing locations, positioned at the proper z-axis dispensing position previously determined using the touch probe, and material is dispensed onto the top surface of the circuit board.

There are drawbacks associated with the touch probe and calibration procedure described above. First, the procedure is relatively time consuming since at each dispensing location, the pump and dispenser assembly must be slowly lowered towards the circuit board. If the pump and dispenser assembly is moved too quickly, then any time delay associated with the detection of the ring 30 and the stopping of the servo motors will result in errors in determining the proper z-axis dispensing position. Even when the probe is moved relatively slowly, any delay in stopping the servo motors may still result in unacceptable error.

SUMMARY OF THE INVENTION

Embodiments of the present invention are directed to a method and apparatus for measuring the height of the surface of a substrate onto which material is to be dispensed by a dispensing system.

One embodiment of the present invention is directed to a dispensing system for dispensing material onto a top surface of a substrate. The dispensing system includes a housing, a dispensing apparatus that dispenses a metered quantity of material, and a measuring probe positionable over the substrate to measure a distance from a reference point on the measuring probe to a location on the top surface of the substrate.

In an alternate version of the first embodiment, the measuring probe has an output to provide at least one measurement signal indicative of the distance from the reference point to the top surface of the substrate. The dispensing system further comprises a controller that receives the at least one measurement signal.

In another alternate version of the first embodiment, the measuring probe has a retracted state and an actuated state, and the measuring probe includes a probe end that in the retracted state is at a first distance from the reference point, and in the actuated state is at a second distance from the reference point.

In another alternate version of the first embodiment, the measuring probe has an input to receive a voltage signal, and the measuring probe is adapted to provide the at least one measurement signal in response to the voltage signal.

In another alternate version of the first embodiment, the measuring probe includes an actuator that in response to an actuation signal controls the measuring probe to be in one of the actuated state and the retracted state.

In another alternate version of the first embodiment, the dispensing system further includes a moving apparatus that positions the measuring probe along first, second and third orthogonal axes. The first and second axes are parallel to the top surface of the substrate and the third axes is perpendicular to the top surface of the substrate.

In yet another alternate version of the first embodiment, the controller of the dispensing system is programed to calculate the distance from the reference point of the measuring probe to the surface of the substrate based on the at least one measurement signal.

In another alternate version of the first embodiment, the controller is programmed to calculate the height of the substrate based on the at least measurement signal.

In another alternate version of the first embodiment, the dispensing apparatus has a dispensing nozzle having a dispensing end for dispensing the material, and the controller is programmed to calculate, based on the height of the substrate, a dispensing position on the third axis at which the nozzle end is at a predetermined distance from the top surface of the substrate.

In yet another alternate version of the first embodiment, the moving apparatus of the dispensing system is coupled to the dispensing apparatus to move the dispensing end to a position along the first, second and third axes. In this alternate version, the controller is coupled to the moving apparatus and is programmed to control the moving apparatus to move the dispensing end to the dispensing position on the third axis prior to dispensing material onto the substrate.

A second embodiment of the present invention is directed to a method for dispensing material onto a top surface of a substrate using a dispensing system having a dispensing apparatus at a dispensing distance from the top surface of the substrate. The method includes steps of loading a substrate onto a support plate on the dispensing apparatus, positioning a measuring probe above the substrate at a predetermined height above the support plate, measuring a distance between the measuring probe and the top surface of the substrate, positioning the dispensing apparatus at the dispensing distance above the top surface of the substrate, and dispensing material onto the substrate.

In an alternate version of the second embodiment, the measuring probe has a probe end, and the measuring probe has a retracted state and actuated state. In this alternate version, the method further includes steps of positioning the measuring probe, in the retracted state, above the substrate, and switching the probe from the retracted state to the actuated state, such that the probe end is positioned on the top surface of the substrate.

In another alternate version of the second embodiment, the measuring step includes steps of applying a primary voltage signal to the measuring probe, and receiving at least one secondary voltage signal from the measuring probe having signal characteristics indicative of the distance between the top surface of the substrate and the measuring probe.

In yet another alternate version of the second embodiment, the measuring probe is coupled to the dispensing apparatus, and the step of positioning the measuring probe at a predetermined height includes a step of positioning the dispensing apparatus at the predetermined height, and the step of measuring includes a step of maintaining the dispensing apparatus at the predetermined height during the measuring step.

A third embodiment of the present invention is directed to a dispensing system for dispensing material onto a top surface of a substrate. The dispensing system includes a housing, a dispensing apparatus that dispenses a quantity of material, and means for measuring the distance from a reference point on the dispensing system to a location on the top surface of the substrate.

In an alternate version of the third embodiment, the dispensing system further includes control means for positioning the dispensing apparatus along first, second and third orthogonal axes, wherein the first and second axes are parallel to the top surface of the substrate and the third axis is perpendicular to the top surface of the substrate.

In another alternate version of the third embodiment, the dispensing nozzle has a dispensing end for dispensing material and the means for positioning includes means for calculating a dispensing position on the third axis at which the dispensing end is at a predetermined distance from the top surface of the substrate.

In yet another alternate version of the third embodiment, the means for controlling includes means for moving the dispensing end to the dispensing position on the third axis prior to dispensing material onto the substrate.

BRIEF DESCRIPTION OF THE DRAWINGS

For a better understanding of the present invention, reference is made to the drawings which are incorporated herein by reference and in which.

DETAILED DESCRIPTION

For purposes of illustration only, and not to limit generality, the present invention will now be explained with reference to a dispensing system used to dispense material onto a top surface of a printed circuit board. One skilled in the art will appreciate, however, that embodiments of the present invention are not limited to dispensing systems, and are not limited to dispensing systems for printed circuit boards, but rather, the measuring apparatus and method in accordance with embodiments of the present invention may be used in other applications requiring precise distance or height measurements.

Figure 1A:
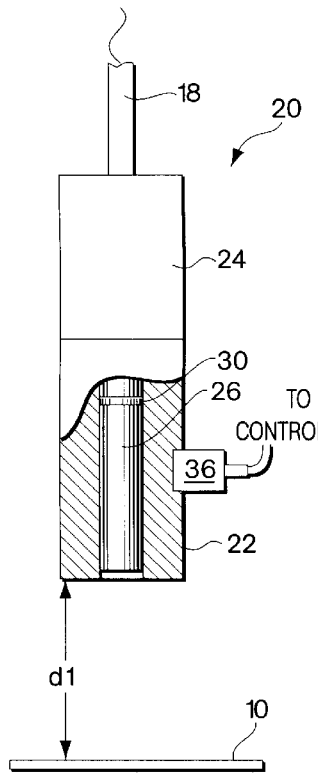
FIG. 1A shows a partially broken away view of a touch probe in a retracted position used in a dispensing system in accordance with the prior art.
Figure 1B:
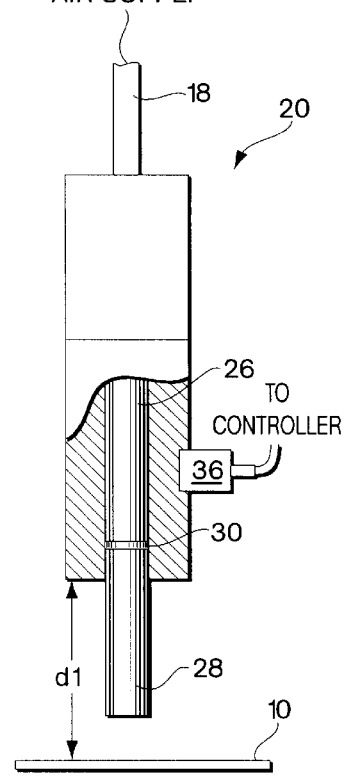
FIG. 1B shows the touch probe of FIG. 1A in an actuated position.
Figure 1C:
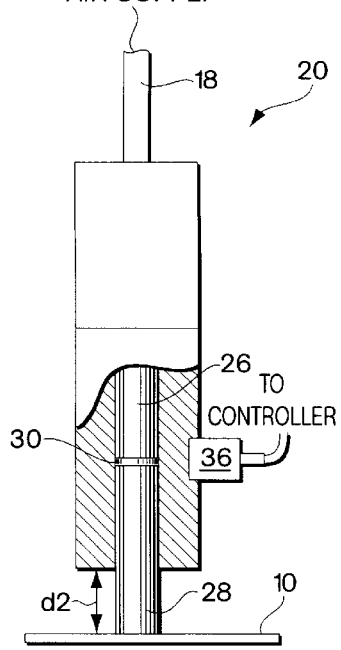
FIG. 1C shows the touch probe of FIG. 1A in a measurement position.
Figure 2A:
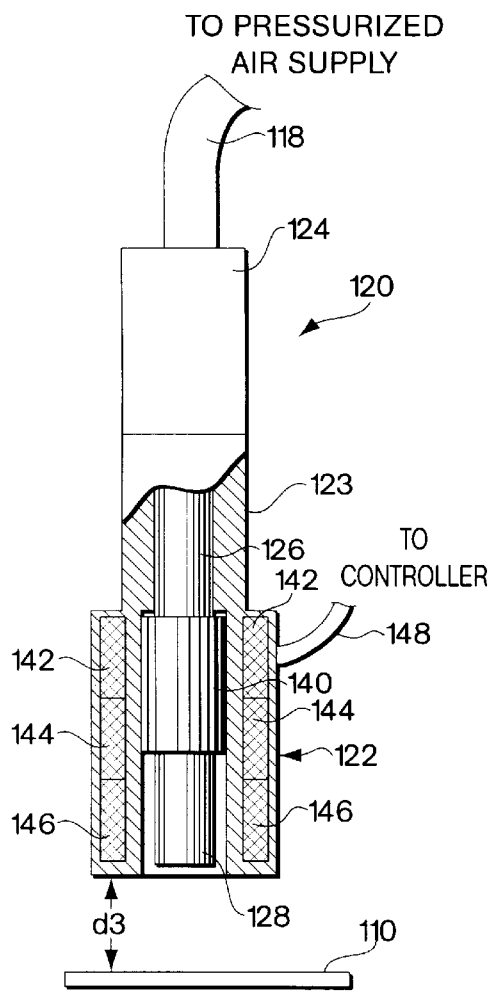
FIG. 2A shows a measurement probe in a retracted position in accordance with one embodiment of the present invention.
Figure 2B:
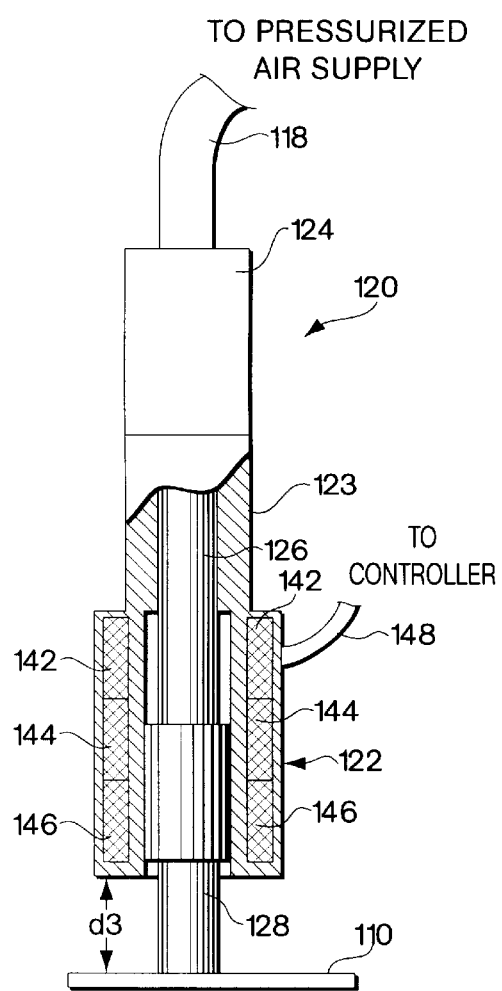
FIG. 2B shows the measurement probe of FIG. 2A in an actuated position.

A measuring probe 120 in accordance with one embodiment of the present invention for measuring the height of an upper surface of a printed circuit board in a dispensing system is shown in FIGS. 2A and 2B. FIG. 2A shows the measuring probe 120 in a retracted state, while FIG. 2B shows the measuring probe 120 in an actuated state. Similar to the touch probe device of the prior art described above, the measuring probe 120, in accordance with one embodiment of the present invention, is designed to mount to a pump and dispenser assembly of a dispensing system.

The measuring probe 120 includes a pneumatic actuator 124 connected to an air line 118 to receive air from a pressurized air source (not shown). In one embodiment of the present invention, the pneumatic actuator is implemented using a single acting, spring return air cylinder, part no. NCJ12 available from SMC Pneumatics, Inc., Topsfield, Mass. The pneumatic actuator is connected to an extension cylinder 123, which is connected to an electromechanical transducer 122. In FIGS. 2A and 2B, the extension cylinder and the pneumatic actuator are shown in a partially broken away view. A cylinder 126 extends from the pneumatic actuator 124 through the extension cylinder 123, and in the actuated position of the probe (FIG. 2B), into the electromechanical transducer. The cylinder is connected to one end of a core 140 of the electromechanical transducer. A probe 128 is connected to the other end of the core 140.

The electromechanical transducer includes three coil assemblies 142, 144 and 146 that surround the core 140. Coils 142 and 146 are secondary coils, while coil 144 is a primary coil. Control lines 148 are connected to the three coil assemblies and are connected to the controller of the dispensing system. In one embodiment of the present invention, the electromechanical transducer is implemented using an LVDT device, available as part no. MHR100 from Lucas Control Systems, Hampton, Va.

The electromechanical transducer provides output signals that indicate the position of the core within the transducer. The core of the transducer is made from a high permeability material and is disposed in a channel within the transducer to allow frictionless movement of the core within the transducer. Each of the coils 142, 144 and 146 is of a cylindrical shape, with the secondary coils 142 and 146 being symmetrically disposed about the primary coil to form the channel that contains the core. When a measurement is to be performed using the transducer, the primary coil 144 is energized by an AC source, causing voltages to be induced into each of the secondary coils 142 and 146. The magnitude and phase of the voltages induced in the secondary coils are a function of the position of the core within the transducer. By measuring the magnitude and phase of the induced voltages, the position of the core can be precisely determined with infinite resolution. The transducer provides a dynamic range of position measurement equal to the total distance that the core can travel within the channel. In one embodiment of the present invention, this dynamic range is equal to 0.200 inches.

Figure 3:
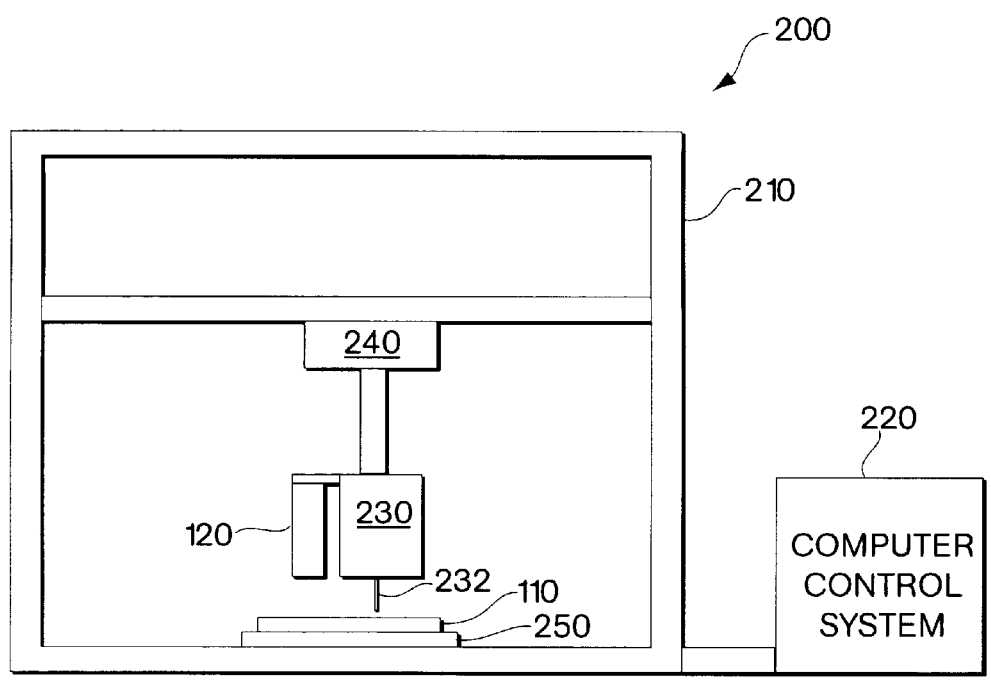
FIG. 3 shows a dispensing system incorporating the touch probe of FIG. 2A in accordance with one embodiment of the present invention.

FIG. 3 shows one embodiment of a dispensing system 200 incorporating the measuring probe 120 in accordance with the present invention. The dispensing system includes a housing 210, a computer control system 220 and a pump and dispenser assembly 230. The pump and dispenser assembly is supported by a moving apparatus 240 that includes servo motors that are controlled by the computer control system to move the pump and dispenser assembly along horizontal x and y axes and a vertical z axis. The measuring probe 120 is coupled to the pump and dispenser assembly 230, and thus, can be positioned using the moving apparatus 240 under the control of the computer control system 220. The dispensing system 200 has a support plate 250 for supporting a circuit board 110 to receive material dispensed from the dispensing system.

The computer control system 220 controls the dispensing of material from the pump and dispenser apparatus 230, positions the pump and dispenser apparatus 230 and the measuring probe 120 by controlling the moving apparatus 240, controls the flow of pressurized air to the measuring probe 120 and receives measurement data from the measuring probe 120 to determine the height of the top surface of the circuit board 110. In one embodiment of the present invention, the computer control system 220 is implemented using a personal computer system based on the Intel® 486 microprocessor using the Microsoft® DOS operating system.

Figure 4:
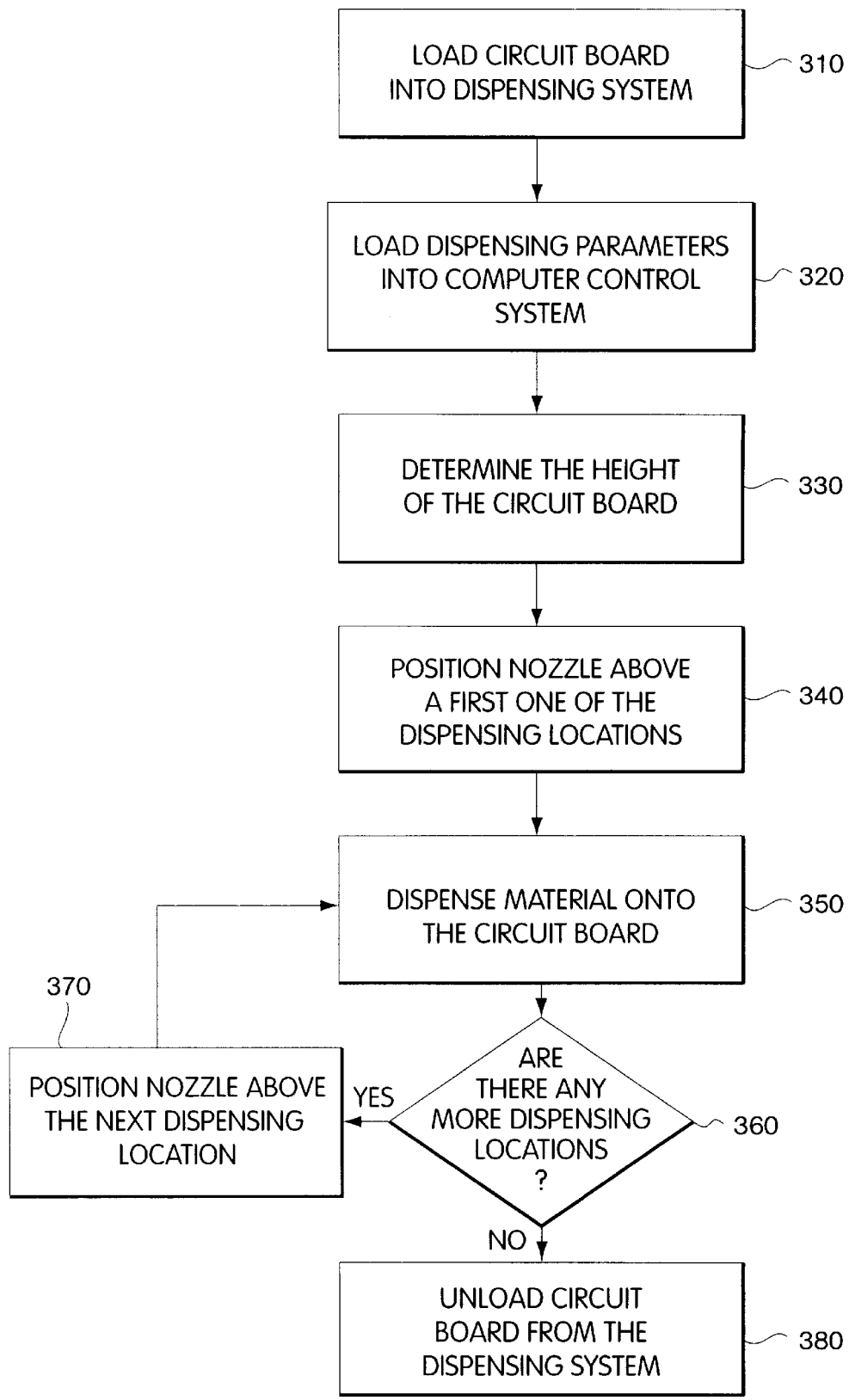
FIG. 4 shows a flow diagram of a process by which the dispensing system of FIG. 3 dispenses material onto a top surface of a circuit board.

The operation of the dispensing system 200 using the measuring probe 120 in accordance with embodiments of the present invention will now be described with reference to FIG. 4, which shows a flow diagram of the steps involved with dispensing material onto the top surface of a printed circuit board. In step 310, a circuit board is loaded into the dispensing system. In the embodiment of the dispensing system shown in FIG. 3, the circuit board is loaded manually into the dispensing system. In alternate embodiments of the present invention, the dispensing system may be coupled to a conveyor system that automatically loads and unloads circuit boards to and from the dispensing system.

In step 320, dispensing parameters for the circuit board are loaded into the computer control system. The dispensing parameters may be stored on magnetic media either internal or external to the computer control system and loaded into the computer control system using an appropriate magnetic media reading apparatus, or the dispensing parameters may be manually entered into the computer control system by an operator of the dispensing system.

The dispensing parameters include the locations on the circuit board at which material is to be dispensed, the distance above the top surface of the circuit board at which the nozzle is to be positioned during dispensing, the average height of circuit boards of the type loaded into the dispensing system, and the quantity and type of material to be dispensed. During step 330, the dispensing system uses the measuring probe 120 to measure the height of the top surface of the circuit board at each of the dispensing locations.

The process by which the height of the circuit board is measured at each dispensing location will be described with reference to FIG. 5, which shows a flow diagram of the process. In step 410 of FIG. 5, the computer control system controls the moving apparatus 240 to position the measuring probe above a first dispensing location on the circuit board. The z-axis position of the measuring probe during the measurement process is determined based on the average height of the circuit board, and based on the dynamic range of the measuring probe, such that for a circuit board of average height, distance $d_3$ (see FIG. 2A), between the bottom of the electromechanical transducer and the top surface of the circuit board is equal to half of the dynamic range of the measurement probe.

Once the measuring probe is properly positioned over the dispensing location, and in the retracted position, as shown in FIG. 2A, the computer controller controls the pressurized air source to apply pressurized air to the pneumatic actuator 124 to actuate the measuring probe (step 420). When the measuring probe is actuated, the cylinder 126 is released, and the cylinder, the core 140 and the probe 128 are allowed to fall under the force of gravity until they contact the circuit board at the dispensing location, as shown in FIG. 2B.

In step 430, a voltage signal is applied to the primary coil 144, and in step 440, the computer controller detects the coupled voltage signals from the secondary coils 142 and 146, determines the position of the core 140 within the electromechanical transducer 122 and determines the distance $d_3$ based on the magnitude and phase of the coupled voltage signals and based on predetermined calibration factors for the electromechanical transducer.

In step 450, the height of the circuit board is calculated based on the known height of the plate on which the circuit board is located and the measured distance $d_3$. The proper z-axis position for the dispenser at the first dispensing location is then calculated based on the height of the circuit board, and the desired dispensing distance between the nozzle and the top surface of the circuit board (step 460). In step 470, the controller controls the pressurized air source to stop supplying pressurized air to the pneumatic actuator to return the measuring probe to the retracted state.

Figure 5:
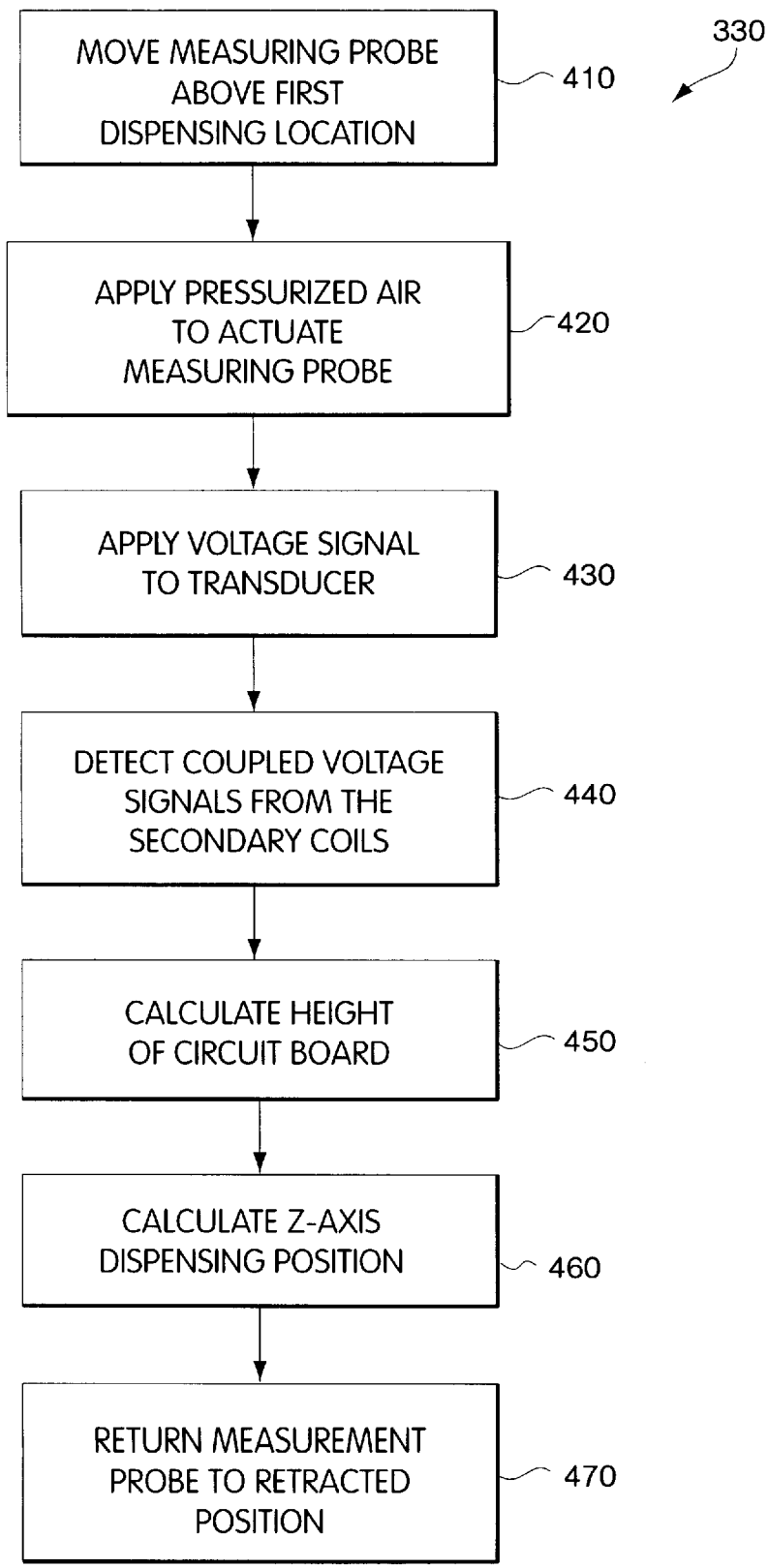
FIG. 5 shows a flow diagram of a measuring step of FIG. 4 in greater detail.

The process shown in FIG. 5 is repeated for each of the dispensing locations on the circuit board. Once the height of the circuit board has been measured at each of the dispensing locations, the pump and dispenser assembly is positioned by the computer system such that the nozzle is at the desired dispensing distance above a first one of the dispensing locations (step 340) and the material is dispensed onto the circuit board at the first dispensing location (step 350).

In step 360, a determination is then made as to whether there are any more dispensing locations on the circuit board. If the result of step 360 is "yes", then the pump and dispenser apparatus is moved, such that the nozzle is positioned over the next dispensing location (step 370), and material is dispensed on the circuit board at the next dispensing location (step 350). Steps 350 and 370 are repeated until material has been dispensed at each of the dispensing locations on the circuit board, so that the result of step 360 is "no". The circuit board is then removed from the dispensing apparatus (step 380) and the process of FIGS. 4 and 5 can be repeated to dispense material onto the top surface of another circuit board.

In the embodiment of the invention described above, the height of each circuit board is measured at each dispensing location. As understood by those skilled in the art, for a lot of circuit boards for which there is little variability among circuit boards and for which there is little variation in height at different dispensing locations on each circuit board, then the height may be measured on less than all the boards and at less than all dispensing locations.

In one embodiment of the present invention described above, an electromechanical transducer utilizing LVDT technology is used to determine the position of a probe once the measuring probe has been actuated. The present invention is not limited to measuring probes that utilize LVDT technology, but rather, other techniques for determining absolute position can be used in embodiments of the present invention.

Having thus described at least one illustrative embodiment of the invention, alterations, modifications and improvements will readily occur to those skilled in the art. Such alterations, modifications and improvements are intended to be within the scope and spirit of the invention. Accordingly, the foregoing description is by way of example only. It is not intended as limiting. The invention's limit is defined only in the following claims and the equivalents thereto.

What is claimed is:

1. A dispensing system for dispensing material onto a top surface of a substrate, the dispensing system comprising:

a dispensing apparatus that dispenses a quantity of material; and means for measuring a distance between a reference point on the dispensing apparatus and a location on the top surface of the substrate, wherein the dispensing apparatus is coupled to the means for measuring a distance;

wherein the means for measuring includes:

walls forming a chamber having an open end;

a measuring probe contained within the chamber having a probe end extendable a distance beyond the open end of the chamber; and means for detecting the distance that the probe end is extended from the chamber.

2. The dispensing system of claim 1, further comprising means for positioning the dispensing apparatus along, first, second and third orthogonal axes, wherein the first and second axes are parallel to the top surface of the substrate and the third axis is perpendicular to the top surface of the substrate.

3. The dispensing system of claim 2, wherein:

the dispensing apparatus has a dispensing nozzle having a dispensing end for dispensing material; and the means for positioning includes means for calculating a dispensing position on the third axis at which the dispensing end is at a predetermined distance from the top surface of the substrate.

4. The dispensing system of claim 3, wherein the means for positioning includes means for moving the dispensing end to the dispensing position on the third axis prior to dispensing material onto the substrate.

5. A dispensing system for dispensing material onto a top surface of a substrate, the dispensing system comprising:

a dispensing apparatus having a nozzle that dispenses a quantity of material; and a measurement apparatus, coupled to the dispensing apparatus, to determine a distance from a point on the top surface of the substrate to a reference point within the dispensing system, the measurement apparatus having:

walls forming a chamber having an open end;

a measuring probe contained within the chamber having a probe end extendable a distance beyond the open end of the chamber to contact the surface of the substrate; and a detection circuit to detect the distance that the probe end is extended from the chamber for positioning of the nozzle at a desired distance from the substrate.

6. The dispensing system of claim 5, wherein the measurement apparatus has an output to provide at least one measurement signal indicative of the distance that the probe end is extended from the chamber, and wherein the dispensing system further comprises a controller coupled to the measurement apparatus to receive the at least one measurement signal.

7. The dispensing system of claim 6, wherein the reference point is located on the nozzle.

8. The dispensing system of claim 5, wherein the measurement apparatus includes an actuator having an actuated state to place the measuring probe in an extended position and a retracted state to place the measuring probe in a retracted position.

\* \* \* \* \*